United States Patent
Yamamoto et al.

(10) Patent No.: US 10,374,541 B2
(45) Date of Patent: Aug. 6, 2019

(54) MOTOR CONTROL SYSTEM AND METHOD FOR DETECTING ABNORMALITY IN RESOLVER/DIGITAL CONVERTER

(71) Applicant: TOYOTA JIDOSHA KABUSHIKI KAISHA, Toyota-shi (JP)

(72) Inventors: Kazuya Yamamoto, Toyota (JP); Yu Sasaki, Toyota (JP)

(73) Assignee: TOYOTA JIDOSHA KABUSHIKI KAISHA, Toyota-shi (JP)

(*) Notice: Subject to any disclaimer, the term of this patent is extended or adjusted under 35 U.S.C. 154(b) by 0 days.

(21) Appl. No.: 15/939,599

(22) Filed: Mar. 29, 2018

(65) Prior Publication Data
US 2018/0342972 A1  Nov. 29, 2018

(30) Foreign Application Priority Data
May 25, 2017 (JP) .................. 2017-104007

(51) Int. Cl.
*G01R 31/02* (2006.01)
*H02P 27/04* (2016.01)
*H03M 1/10* (2006.01)
*H03M 1/64* (2006.01)

(52) U.S. Cl.
CPC ........ *H02P 27/045* (2013.01); *H03M 1/1076* (2013.01); *H03M 1/645* (2013.01)

(58) Field of Classification Search
CPC ............ H02P 29/00; H02P 6/16; H02K 11/21
See application file for complete search history.

(56) References Cited

U.S. PATENT DOCUMENTS

| | | |
|---|---|---|
| 2005/0278090 A1 | 12/2005 | Kushihara |
| 2014/0172359 A1 | 6/2014 | Komatsu |
| 2017/0227567 A1* | 8/2017 | Son .................. G01B 7/30 |

FOREIGN PATENT DOCUMENTS

| | | |
|---|---|---|
| JP | 2005-345189 | 12/2005 |
| JP | 2006-349561 | 12/2006 |
| JP | 2014-119284 | 6/2014 |

* cited by examiner

*Primary Examiner* — Karen Masih
(74) *Attorney, Agent, or Firm* — Oblon, McClelland, Maier & Neustadt, L.L.P.

(57) ABSTRACT

A motor control system includes a motor, a resolver configured to detect a rotation angle of the motor, a resolver/digital converter configured to convert an analog angle signal output from the resolver into a digital angle signal, and a motor control unit configured to control the motor based on the digital angle signal output from the resolver/digital converter and determine, when an integrated value obtained by integrating the digital angle signal at a predetermined time interval is not within a threshold range, that the resolver/digital converter is abnormal. The motor control unit increases the time interval for the integration when a rotation speed of the motor decreases and decreases the time interval for the integration when the rotation speed of the motor increases.

4 Claims, 6 Drawing Sheets

MOTOR CONTROL SYSTEM AND METHOD FOR DETECTING ABNORMALITY IN RESOLVER/DIGITAL CONVERTER

CROSS REFERENCE TO RELATED APPLICATIONS

This application is based upon and claims the benefit of priority from Japanese patent application No. 2017-104007, filed on May 25, 2017, the disclosure of which is incorporated herein in its entirety by reference.

BACKGROUND

The present disclosure relates to a motor control system and a method for detecting an abnormality in a resolver/digital converter. In particular, the present disclosure relates to a motor control system that detects an abnormality in a resolver/digital converter that converts an analog angle signal output from a resolver that detects a rotation angle of a motor into a digital angle signal, and a method for detecting an abnormality in a resolver/digital converter.

Japanese Unexamined Patent Application Publication No. 2014-119284 (hereinafter referred to as Patent Literature 1) discloses a technique in which a redundant system is formed by providing two resolvers so that an abnormality in the resolvers can be detected. Specifically, an abnormality in at least one of the resolvers is detected by comparing signals output from these resolvers with each other. It should be noted that Patent Literature 1 fails to mention detection of an abnormality in a resolver/digital converter (hereinafter referred to as an R/D converter).

Japanese Unexamined Patent Application Publication No. 2005-345189 (hereinafter referred to as Patent Literature 2) discloses a technique in which an abnormality in an R/D converter is diagnosed (i.e., detected) by itself by using a simulation signal simulating an analog angle signal output from a resolver. Specifically, an abnormality in the R/D converter is detected by comparing the simulation signal input to the R/D converter with a digital signal output from the R/D converter.

Japanese Unexamined Patent Application Publication No. 2006-349561 (hereinafter referred to as Patent Literature 3) discloses a technique in which an abnormality in a resolver is detected by sampling an analog angle signal (a sine signal or a cosine signal) output from the resolver in a cycle of $\frac{1}{2}n$ ($n \geq 2$). Specifically, the resolver is determined to be abnormal when an integrated value of analog angle signals sampled in the above-described cycle is not within a threshold range. It should be noted that Patent Literature 3 fails to mention detection of an abnormality in an R/D converter.

SUMMARY

The present inventors have found the following problem in the above-described motor control system techniques for detecting an abnormality in an R/D converter.

In the technique disclosed in Patent Literature 1, an abnormality in a resolver is detected by using the redundant system. Therefore, a configuration of the motor control system becomes complicated and increases in size, and hence a manufacturing cost for the motor control system increases. It should be noted that when the technique disclosed in Patent Literature 1 is adapted to detection of an abnormality in an R/D converter, a problem similar to the above-described problem occurs.

The technique disclosed in Patent Literature 2 can detect an abnormality in the R/D converter only when the R/D converter is performing a self-diagnosis by using a simulation signal. Therefore, the technique disclosed in Patent Literature 2 cannot detect an abnormality in the R/D converter in real time while converting an analog angle signal output from the resolver into a digital signal.

When the technique for detecting an abnormality in a resolver disclosed in Patent Literature 3 is applied as it is to detect an abnormality in an R/D converter, an abnormality cannot be accurately detected when a rotation speed of a motor is changed. The reason why an abnormality cannot be accurately detected is explained hereinafter with reference to FIG. 6.

FIG. 6 is a graph for explaining a problem to be solved by the present disclosure, and is a graph showing changes in a digital angle signal $\theta d$ and its integrated value $\theta s$ over time. The digital angle signal $\theta d$ shown in an upper part of FIG. 6 is output values of the R/D converter, and has digital values representing rotation angles $\theta$ of the motor detected by the resolver. The integrated values $\theta s$ shown in a lower part of FIG. 6 are integrated values obtained by integrating (i.e., adding up) the digital angle signal $\theta d$ at each sampling point indicated by a dot in the graph. When the integrated value $\theta s$ is not within a threshold range from $-\theta t$ to $\theta t$, the R/D converter is determined to be abnormal. FIG. 6 shows an example in which the R/D converter is normal, and an inclination of the digital angle signal $\theta d$ shown in the upper part changes, indicating a drop in the rotation speed of the motor.

As shown in FIG. 6, the time intervals between samplings are constant even when the rotation speed of the motor has decreased. Therefore, the number of times of sampling, i.e., the number of times of integration (i.e., the number of times of addition) of the digital angle signal $\theta d$ in a period in which the motor makes one rotation increases. Therefore, there are cases in which the integrated value $\theta s$ decreases or increases beyond the threshold range ($-\theta t$ to $\theta t$) and hence it is falsely determined that the R/D converter is abnormal even though the R/D converter is normal. In the example shown in FIG. 6, the integrated value $\theta s$ decreases beyond the lower limit value $-\theta t$ and the R/D resolver is falsely determined to be abnormal.

As described above, when the number of times of integration (hereinafter simply expressed as the number of integrations) of the digital angle signal $\theta d$ in the period in which the motor makes one rotation excessively increases, the R/D converter could be determined to be abnormal even though it is normal. On the other hand, when the number of integrations of the digital angle signal $\theta d$ in the period in which the motor makes one rotation excessively decreases, the time required for the determination about an abnormality increases and the detection accuracy deteriorates.

As described above, when the technique for detecting an abnormality in a resolver disclosed in Patent Literature 3 is applied as it is to detect an abnormality in an R/D converter, an abnormality cannot be accurately detected when the rotation speed of the motor is changed.

The present disclosure has been made in view of the above-described circumstance and an object thereof is to provide a motor control system capable of accurately detecting an abnormality in a resolver/digital converter in real time even when a rotation speed of a motor is changed, while preventing the motor control system from becoming complicated or increasing in size and thereby preventing the cost for the motor control system from increasing.

A first exemplary aspect is a motor control system including:
 a motor;
 a resolver configured to detect a rotation angle of the motor;
 a resolver/digital converter configured to convert an analog angle signal output from the resolver into a digital angle signal; and
 a motor control unit configured to control the motor based on the digital angle signal output from the resolver/digital converter and determine, when an integrated value obtained by integrating the digital angle signal at a predetermined time interval is not within a threshold range, that the resolver/digital converter is abnormal, in which
 the motor control unit increases the time interval when a rotation speed of the motor decreases and decreases the time interval when the rotation speed of the motor increases.

In the motor control system according to an aspect of the present disclosure, it is determined that the resolver/digital converter is abnormal when the integrated value, which is obtained by integrating the digital angle signal at the predetermined time interval, is not within the threshold range. In doing so, when the rotation speed of the motor decreases, the time interval, at which the digital angle signal is integrated, is increased. Further, when the rotation speed of the motor increases, the time interval is decreased.

Consequently, it is possible to prevent the number of integrations of digital angle signals θd in a period in which the motor makes one rotation from changing even when the rotation speed of the motor has changed, and thereby accurately detect an abnormality in the R/D converter RDC.

Further, in the motor control system according to an aspect of the present disclosure, it is possible to detect an abnormality in the resolver/digital converter in real time while converting an analog angle signal output from the resolver into a digital angle signal without adopting a redundant system.

As described above, the motor control system according to an aspect of the present disclosure makes it possible to accurately detect an abnormality in a resolver/digital converter in real time even when a rotation speed of a motor is changed, while preventing the motor control system from becoming complicated or increasing in size and thereby preventing the cost for the motor control system from increasing.

The time interval may be successively increased as the rotation speed of the motor decreases, and the time interval may be successively decreased as the rotation speed of the motor increases.

By the above-described configuration, it is possible to detect an abnormality in the resolver/digital converter more accurately.

Further, the motor control unit may obtain the rotation speed of the motor based on a drive current of the motor.

By the above-described configuration, it is possible to reduce a deviation of the obtained rotation speed of motor from the actual rotation speed thereof.

Another exemplary aspect is a method for detecting an abnormality in a resolver/digital converter, including:
 converting, by a resolver/digital converter, a rotation angle of a motor detected by a resolve into a digital angle signal and integrating the obtained digital angle signal at a predetermined time interval; and
 determining, when the integrated value of the digital angle signal is not within a threshold range, that the resolver/digital converter is abnormal, in which the time interval is increased when a rotation speed of the motor decreases, and is decreased when the rotation speed of the motor increases.

In the method for detecting an abnormality in the resolver/digital converter according to an aspect of the present disclosure, it is determined that the resolver/digital converter is abnormal when the integrated value, which is obtained by integrating the digital angle signal at the predetermined time interval, is not within the threshold range. In doing so, when the rotation speed of the motor decreases, the time interval, at which the digital angle signal is integrated, is increased, whereas when the rotation speed of the motor increases, the time interval is decreased.

Consequently, it is possible to prevent the number of integrations of digital angle signals θd in a period in which the motor makes one rotation from changing even when the rotation speed of the motor has changed, and thereby accurately detect an abnormality in the R/D converter RDC.

Further, in the method for detecting an abnormality in the resolver/digital converter according to an aspect of the present disclosure, it is possible to detect an abnormality in the resolver/digital converter in real time while converting an analog angle signal output from the resolver into a digital angle signal without adopting a redundant system.

As described above, the method for detecting an abnormality in the resolver/digital converter according to an aspect of the present disclosure makes it possible to accurately detect an abnormality in a resolver/digital converter in real time even when a rotation speed of a motor is changed, while preventing the motor control system from becoming complicated or increasing in size and thereby preventing the cost for the motor control system from increasing.

According to the present disclosure, it is possible to provide a motor control system capable of accurately detecting an abnormality in a resolver/digital converter in real time even when a rotation speed of a motor is changed, while preventing the motor control system from becoming complicated or increasing in size and thereby preventing the cost for the motor control system from increasing.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Specific embodiments to which the present disclosure is applied are explained hereinafter in detail with reference to the drawings. However, the present disclosure is not limited to embodiments shown below. Further, the following descriptions and the drawings are simplified as appropriate for clarifying the explanation.

First Embodiment

<Configuration of Motor Control System>

Figure 1:
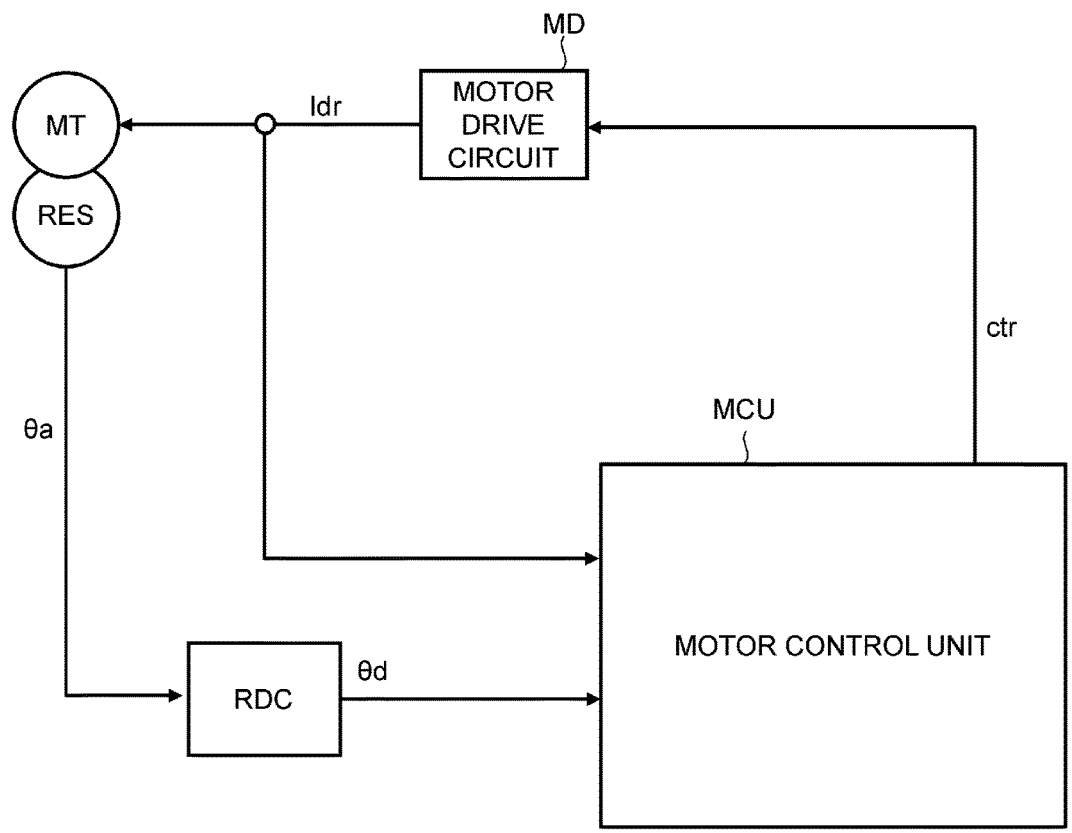
FIG. 1 is a block diagram showing a motor control system according to a first embodiment.

Firstly, a motor control system according to a first embodiment is explained with reference to FIG. 1. FIG. 1 is a block diagram showing a configuration of a motor control system according to the first embodiment. As shown in FIG. 1, the motor control system according to the first embodiment includes a motor MT, a resolver RES, a resolver/digital converter (an R/D converter) RDC, a motor control unit MCU, and a motor drive circuit MD.

The motor MT is, for example, an AC (Alternating Current) servo-motor. The motor MT is driven by a drive current Idr output from the motor drive circuit MD. The drive current Idr is, for example, a three-phase AC current and is fed back to the motor control unit MCU as shown in FIG. 1.

The resolver RES is a rotation angle sensor that detects a rotation angle θ of the motor MT. The resolver RES outputs a resolver signal θa which is an analog angle signal corresponding to the rotation angle θ of the motor MT. In general, the resolver RES includes an exciting coil and a pair of detection coils (not shown). For example, by supplying an exciting signal such as a signal $\sin(\Omega t)$ to the exiting coil, signals $\sin(\theta)\cdot\sin(\omega t)$ and $\cos(\theta)\cdot\sin(\omega t)$ are output from the pair of detection coils, respectively, as the resolver signal θa. Note that ω is an angular speed and t is a time.

The R/D converter RDC converts the resolver signal θa output from the resolver RES into a digital angle signal θd and outputs the obtained digital angle signal θd to the motor control unit MCU. That is, the digital angle signal θd, which is an output value of the R/D converter RDC, is a digital signal indicating the rotation angle θ of the motor MT.

The motor control unit MCU generates a control signal ctr based on the drive current Idr fed back from the motor drive circuit MD and the digital angle signal θd output from the R/D converter RDC, and outputs the generated control signal ctr to the motor drive circuit MD. The control signal ctr is, for example, a PWM (Pulse Width Modulation) signal.

Although it is not shown in FIG. 1, the motor control unit MCU includes, for example, an arithmetic unit such as a CPU (Central Processing Unit), and a storage unit, such a RAM (Random Access Memory) and a ROM (Read Only Memory), in which various control programs and data are stored.

Further, the motor control unit MCU integrates (i.e., adds up) the digital angle signal θd output from the R/D converter RDC at predetermined sampling intervals T and detects an abnormality in the R/D converter RDC based on an integrated value θs obtained by the integration. Specifically, the motor control unit MCU determines that the R/D converter RDC is abnormal when the integrated value θs is not within a predetermined threshold range.

It should be noted that the motor control unit MCU changes the time interval T (hereinafter also referred to as the sampling interval T) at which the digital angle signal θd is integrated, according to the rotation speed of the motor MT. The motor control unit MCU obtains the rotation speed of the motor MT by using, for example, the drive current Idr fed back from the motor drive circuit MD. Specifically, when the rotation speed of the motor MT has decreased, the motor control unit MCU increases the sampling interval T. Further, when the rotation speed of the motor MT has increased, the motor control unit MCU decreases the sampling interval T.

Alternatively, the motor control unit MCU may obtain the rotation speed of the motor MT by using the control signal ctr provided to the motor drive circuit MD. However, compared to the use of the control signal ctr, the use of the drive current Idr can make a deviation of the obtained rotation speed of the motor MT from the actual rotation speed thereof smaller.

Alternatively, the motor control unit MCU may obtain the rotation speed of the motor MT by using the digital angle signal θd output from the R/D converter RDC. However, when there is an abnormality in the R/D converter RDC, the rotation speed of the motor MT obtained in the R/D converter RDC could be inaccurate. Therefore, there is a possibility that the accuracy in the detection of an abnormality in the R/D converter RDC may deteriorate. Therefore, compared to the use of the digital angle signal θd, the use of the drive current Idr enables the motor control unit MCU to detect an abnormality in the R/D converter RDC more accurately.

As a simplest way, when the rotation speed of the motor, which had been higher than a predetermined threshold value, has decreased beyond this threshold value, the sampling interval T may be increased. Further, when the rotation speed of the motor, which had been lower than the threshold value, has increased beyond the threshold value, the sampling interval T may be decreased.

Alternatively, the sampling interval T may be successively increased as the rotation speed of the motor MT decreases. Further, the sampling interval T may be successively decreased as the rotation speed of the motor MT increases. The above-described control enables the motor control unit MCU to detect an abnormality in the R/D converter RDC more accurately.

Details on how the motor control unit MCU detects an abnormality in the R/D converter RDC will be described later.

The motor drive circuit MD outputs the drive current Idr to the motor MT based on the control signal ctr output from the motor control unit MCU. The rotation speed of the motor MT is controlled by the drive current Idr. That is, the motor control unit MCU controls the rotation speed of the motor MT through the motor drive circuit MD. For example, the motor drive circuit MD may be a switching circuit of which the switching is controlled by the control signal ctr which may be in the form of a PWM signal.

Figure 3:
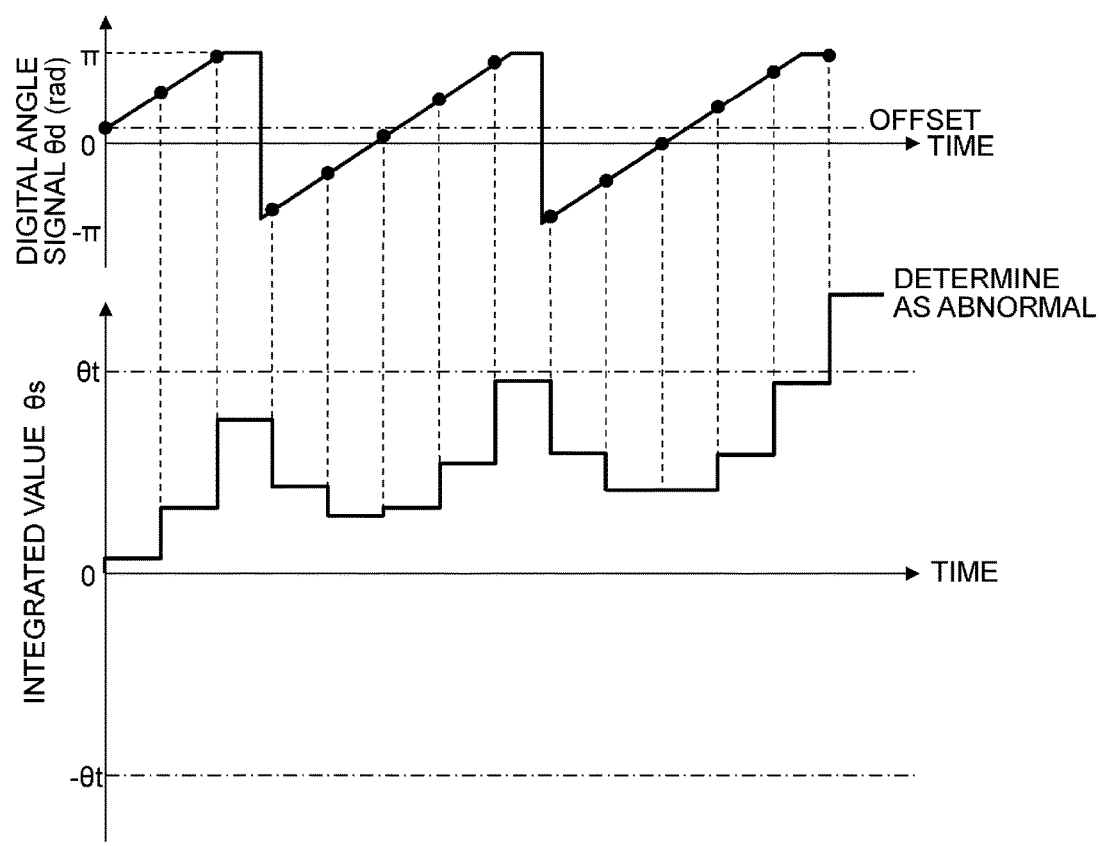
FIG. 3 is a graph showing changes in a digital angle signal θd and its integrated value θs over time.
Figure 4:
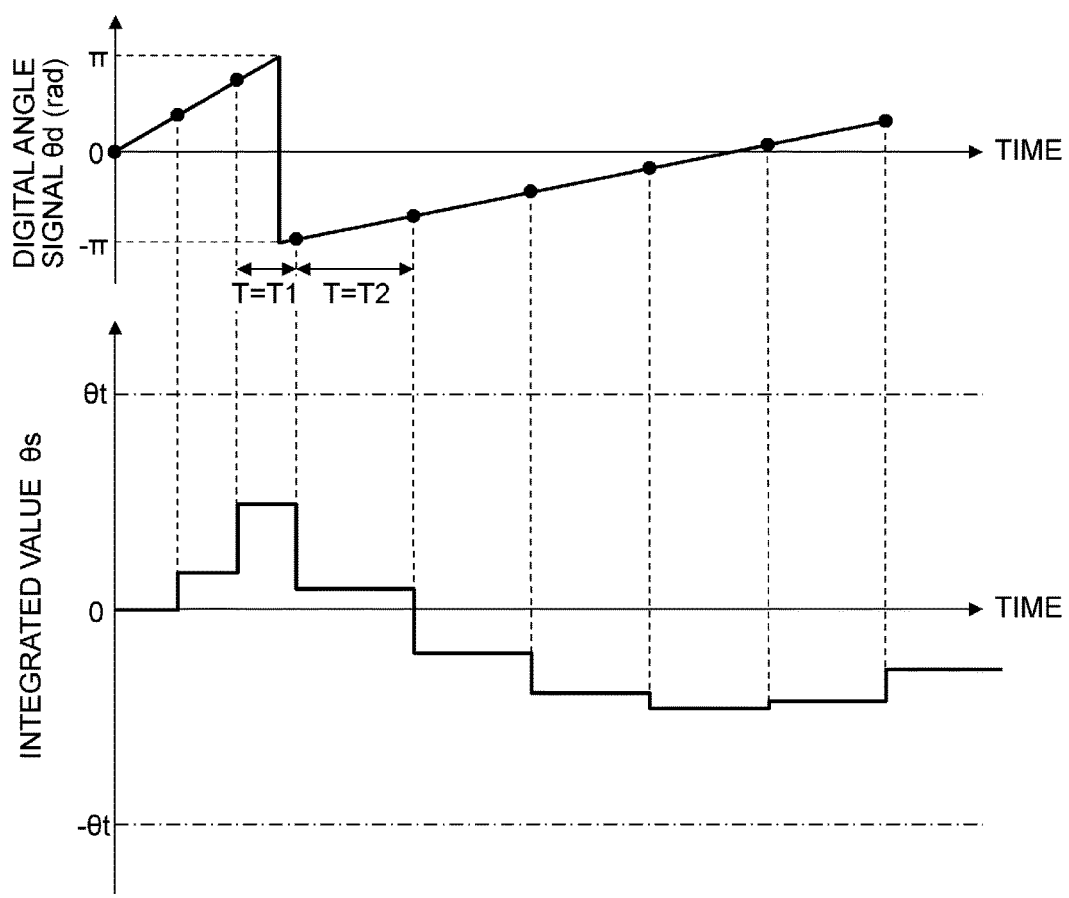
FIG. 4 is a graph showing changes in a digital angle signal θd and its integrated value θs over time.

Next, how the motor control unit MCU detects an abnormality in the R/D converter RDC is explained in detail with reference to FIGS. 2 to 4. For the below explanation, which is given with reference to FIGS. 2 to 4, the block diagram of the motor control system shown in FIG. 1 is also referred to. Each of FIGS. 2 to 4 is a graph showing changes in the digital angle signal θd and its integrated value θs over time.

Figure 2:
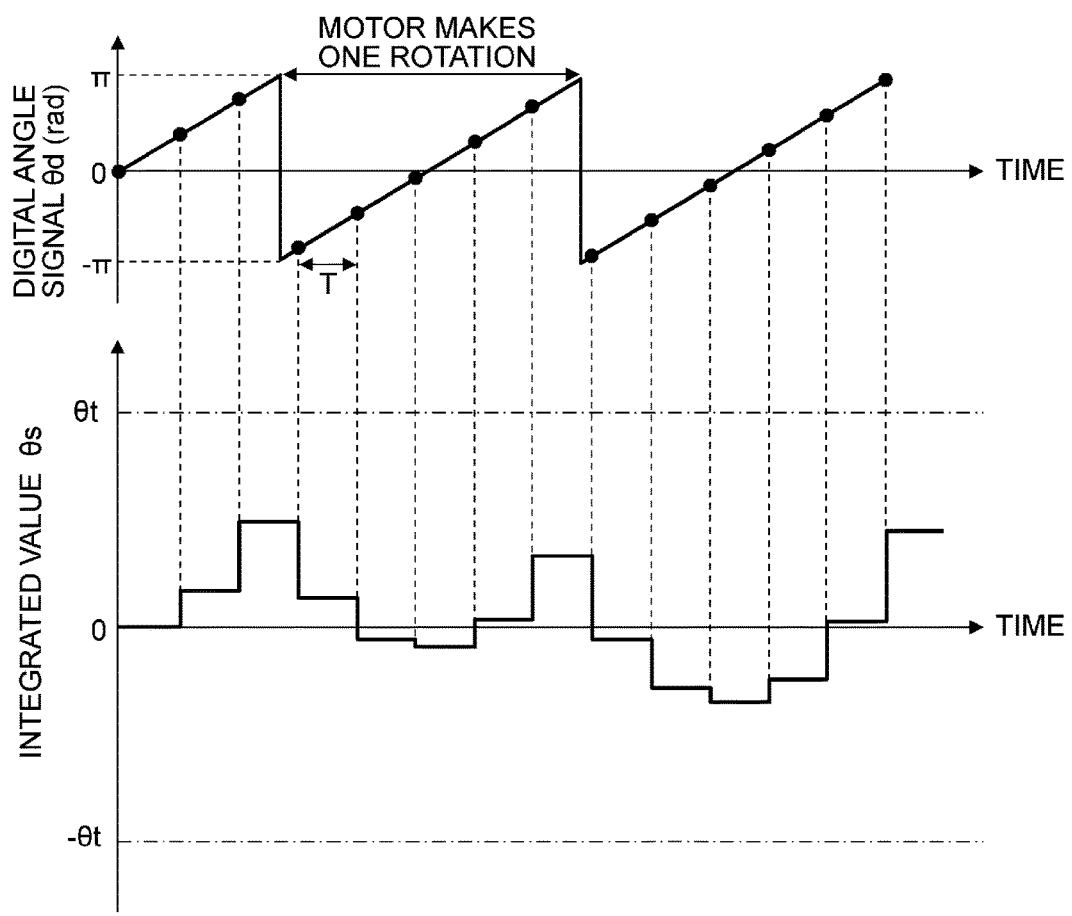
FIG. 2 is a graph showing changes in a digital angle signal θd and its integrated value θs over time.

As shown in FIG. 1, the digital angle signal θd shown in an upper part of FIG. 2 is an output signal of the R/D converter RDC, and has digital values representing rotation angles θ of the motor MT detected by the resolver RES. The integrated values θs shown in a lower part of FIG. 2 are integrated values obtained by integrating (i.e., adding up) the digital angle signal θd at each sampling point indicated by a dot in the graph. When the integrated value θs is not within a threshold range (−θt to θt), the R/D converter RDC is determined to be abnormal.

The example shown in FIG. 2 shows a state in which the rotation speed of the motor MT is constant and the R/D converter RDC is normal.

As shown in the upper part of FIG. 2, the digital angle signal θd, which is the output value of the R/D converter RDC, monotonously increases from −π [rad] to π [rad]. Further, when the digital angle signal θd reaches π [rad], it changes to −π [rad]. Samplings of the digital angle signal θd indicated by dots in the graph are performed a plurality of times in a period in which the motor MT makes one rotation and are performed at the time interval T. In the example shown in FIG. 2, since the rotation speed of the motor MT is constant, the inclination of the digital angle signal θd remains constant as shown in the upper part of FIG. 2.

Further, as shown in the lower part of FIG. 2, the integrated value θs is a value obtained by successively adding the sampled digital angle signal θd. Therefore, the integrated value θs decreases when the digital angle signal θd is no smaller than −π and smaller than 0 (−π [rad]≤θd<0 [rad]) and increases when the digital angle signal θd is larger than 0 and no larger than π (0 [rad]<θd≤π [rad]). Therefore, when the R/D converter RDC is normal, the integrated value θs remains within the threshold value range centered at 0 [rad] from the lower threshold value −θt [rad] to the upper threshold value θt [rad] as shown in the lower part of FIG. 2. Note that the value of the threshold value θt is determined as appropriate based on, for example, the number of times of sampling (hereinafter simply expressed as the number of samplings) in the period in which the motor MT makes one rotation. Note that needless to say, when the digital angle signal θd is zero (θd=0 [rad]), the integrated value θs does not change.

Next, an example shown in FIG. 3 shows a state in which the rotation speed of the motor MT is constant as in the case of FIG. 2, but the R/D converter RDC is abnormal. Specifically, as shown in an upper part of FIG. 3, the R/D converter RDC has an abnormal offset state so that the digital angle signal θd, i.e., the output value of the R/D converter RDC is larger than zero (θd>0 [rad]) when the rotation angle θ of the motor MT is zero (θ=0 [rad]). The digital angle signal θd always indicates a value that is larger than the actual rotation angle θ of the motor MT by an offset value.

Therefore, as shown in a lower part of FIG. 3, the offset value is cumulatively increased every time the digital angle signal θd is integrated (i.e., added up) and the integrated value θs eventually exceeds the upper threshold value θt. As a result, the abnormality in the R/D converter RDC can be detected. As a matter of course, the larger the offset value is, the more quickly the abnormality can be detected.

Note that in the case of an abnormal offset by which the digital angle signal θd is smaller than zero (θd<0 [rad]) when the rotation angle θ of the motor MT is zero (θ=0 [rad]), the integrated value θs eventually exceeds (i.e., decreases beyond) the lower threshold value −θt. As a result, the abnormality in the R/D converter RDC can be detected.

An example shown in FIG. 4 shows a state in which the R/D converter RDC is normal as in the case of FIG. 2 and the inclination of the digital angle signal θd shown in an upper part of FIG. 4 changes, indicating that the rotation speed of the motor has decreased.

As described previously, in the motor control system according to this embodiment, the sampling interval T, at which the digital angle signal θd is integrated, is changed according to the rotation speed of the motor MT. Specifically, when the rotation speed of the motor MT has decreased, the motor control unit MCU increases the sampling interval T. Further, when the rotation speed of the motor MT has increased, the motor control unit MCU decreases the sampling interval T. In the example shown in FIG. 4, when the rotation speed of the motor has decreased, the sampling interval T is changed from an interval T1 to an interval T2 longer than the interval T1.

Figure 6:
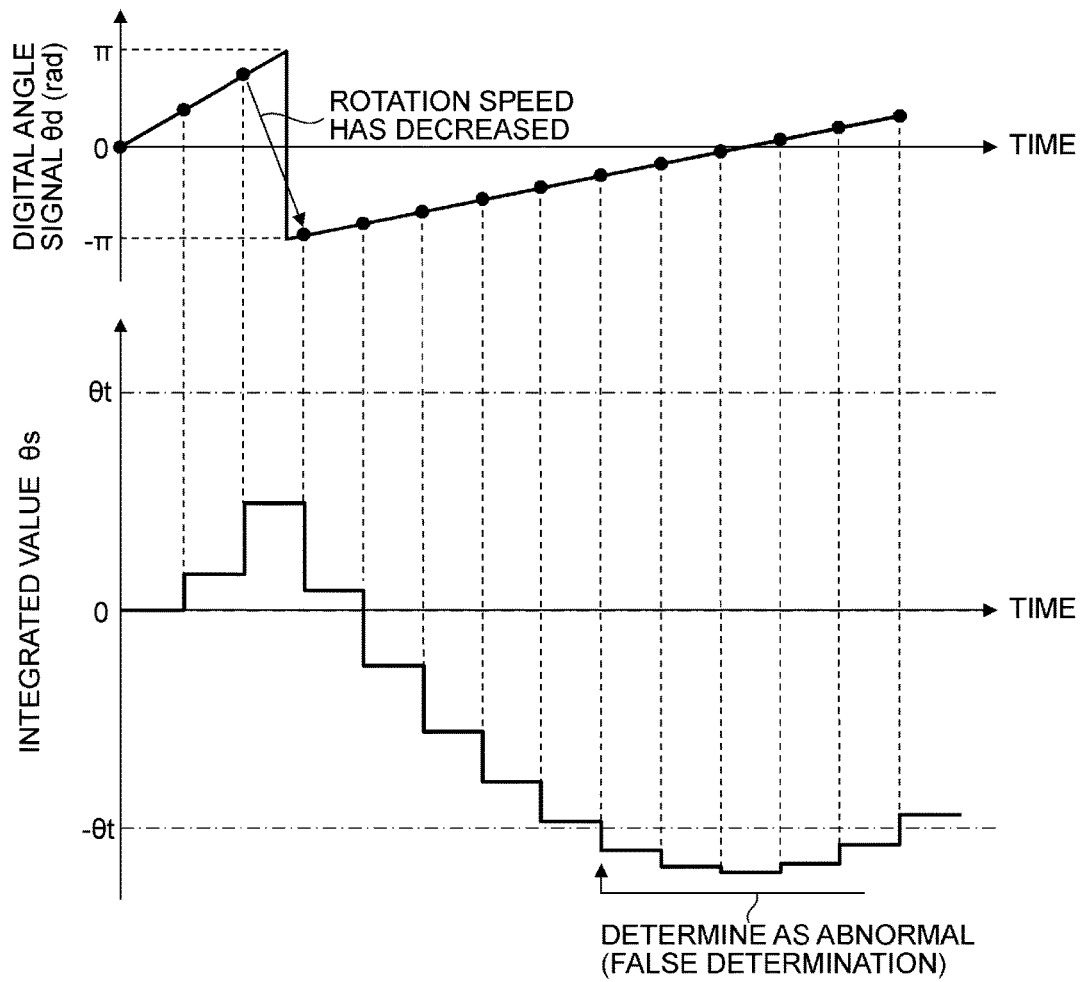
FIG. 6 is a graph for explaining a problem to be solved by the present disclosure, and is a graph showing changes in a digital angle signal θd and its integrated value θs over time.

Therefore, it is possible to prevent the number of samplings, i.e., the number of integrations of the digital angle signal θd in the period in which the motor MT makes one rotation from changing even when the rotation speed of the motor MT has changed. It should be noted that when the number of integrations of the digital angle signal θd in the period in which the motor MT makes one rotation becomes too larger, the motor control unit MCU could falsely determine that the R/D converter RDC is abnormal even though the R/D converter RDC is normal as explained above with reference to FIG. 6. On the other hand, when the number of integrations of the digital angle signal θd in the period in which the motor MT makes one rotation becomes too small, the time required for the determination about an abnormality increases and the detection accuracy deteriorates.

As described above, in the motor control system according to this embodiment, when the rotation speed of the motor MT has decreased, the motor control unit MCU increases the sampling interval T, whereas when the rotation speed of the motor MT has increased, the motor control unit MCU decreases the sampling interval T. Therefore, it is possible to prevent the number of samplings, i.e., the number of integrations of digital angle signals θd in the period in which the motor MT makes one rotation from changing and thereby accurately detect an abnormality in the R/D converter RDC even when the rotation speed of the motor MT has changed.

Further, in the motor control system according to this embodiment, it is possible to detect an abnormality in the R/D converter RDC in real time while converting an analog angle signal θa (a resolver signal θa) output from the resolver RES into a digital angle signal θd without adopting a redundant system.

As described above, the motor control system according to this embodiment makes it possible to accurately detect an abnormality in the R/D converter RDC in real time even when the rotation speed of the motor MT is changed, while preventing the motor control system from becoming complicated or increasing in size and thereby preventing the cost for the motor control system from increasing.

<Method for Detecting Abnormality in Resolver/Digital Converter>

Figure 5:
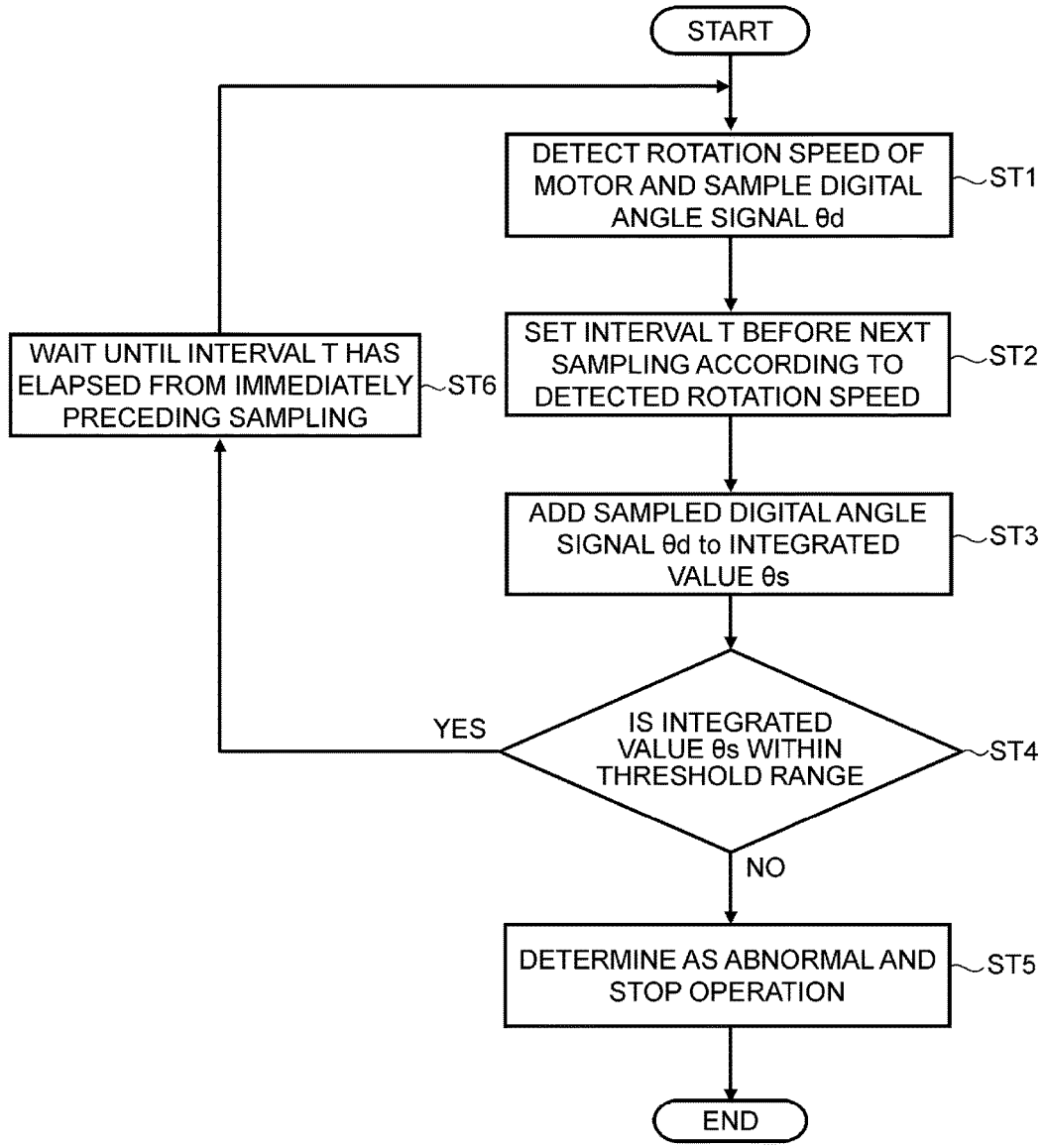
FIG. 5 is a flowchart showing a method for detecting an abnormality in an R/D converter according to the first embodiment.

Next, a method for detecting an abnormality in an R/D converter by using a motor control system according to the first embodiment is explained with reference to FIG. 5. FIG. 5 is a flowchart showing a method for detecting an abnormality in an R/D converter according to the first embodiment. For the below explanation, which is given with reference to FIG. 5, the block diagram of the motor control system shown in FIG. 1 is also referred to.

As shown in FIG. 5, firstly, the motor control unit MCU shown in FIG. 1 detects a rotation speed of the motor MT and samples (i.e., measures) a digital angle signal θd (step ST1). Note that the motor control unit MCU obtains the rotation speed of the motor MT by using, for example, the drive current Idr fed back from the motor drive circuit MD.

Next, the motor control unit MCU sets a sampling interval T between the immediately-preceding sampling of the digital angle signal θd and the next sampling thereof according to the detected rotation speed (step ST2). Specifically, when the rotation speed of the motor MT has decreased, the motor control unit MCU increases the sampling interval T. Further, when the rotation speed of the motor MT has increased, the motor control unit MCU decreases the sampling interval T.

Next, the motor control unit MCU adds the sampled digital angle signal θd to an integrated value θs (step ST3).

Next, the motor control unit MCU determines whether or not the integrated value θs is within a threshold range (−θt to θt) (step ST4).

When the integrated value θs is not within the threshold range (No at step ST4), the motor control unit MCU determines that the R/D converter RDC is abnormal and hence stops the operation of the motor MT. On the other hand, when the integrated value θs is within the threshold range (Yes at step ST4), the motor control unit MCU waits the sampling interval T, which was set in the step ST2, after the immediately-preceding sampling (step ST5) and then returns to the step ST1. That is, the motor control unit MCU detects the rotation speed of the motor MT and samples the digital angle signal θd.

Note that in the step ST1, the detection of the rotation speed of the motor MT and the sampling of the digital angle signal θd do not necessarily have to be simultaneously performed. The step ST2, i.e., the setting of the sampling interval T may be performed after the step ST3 or the step ST4, or before the step ST6.

In the method for detecting an abnormality in an R/D converter according to the first embodiment, the sampling interval T, at which the digital angle signal θd is integrated, is changed according to the rotation speed of the motor MT. Specifically, when the rotation speed of the motor MT has decreased, the motor control unit MCU increases the sampling interval T. Further, when the rotation speed of the motor MT has increased, the motor control unit MCU decreases the sampling interval T.

Therefore, it is possible to prevent the number of samplings, i.e., the number of integrations of the digital angle signal θd in the period in which the motor MT makes one rotation from changing even when the rotation speed of the motor MT has changed. It should be noted that when the number of integrations of the digital angle signal θd in the period in which the motor MT makes one rotation becomes too larger, the motor control unit MCU could falsely determine that the R/D converter RDC is abnormal even though the R/D converter RDC is normal as explained above with reference to FIG. 6. On the other hand, when the number of integrations of the digital angle signal θd in the period in which the motor MT makes one rotation becomes too small, the time required for the determination about an abnormality increases and the detection accuracy deteriorates.

As described above, in the method for detecting an abnormality in an R/D converter according to this embodiment, when the rotation speed of the motor MT has decreased, the motor control unit MCU increases the sampling interval T, whereas when the rotation speed of the motor MT has increased, the motor control unit MCU decreases the sampling interval T. Therefore, it is possible to prevent the number of samplings, i.e., the number of integrations of digital angle signals θd in the period in which the motor MT makes one rotation from changing and thereby accurately detect an abnormality in the R/D converter RDC even when the rotation speed of the motor MT has changed.

Further, in the method for detecting an abnormality in an R/D converter according to this embodiment, it is possible to detect an abnormality in the R/D converter RDC in real time while converting an analog angle signal θa (a resolver signal θa) output from the resolver RES into a digital angle signal θd without adopting a redundant system.

As described above, the method for detecting an abnormality in an R/D converter according to this embodiment makes it possible to accurately detect an abnormality in the R/D converter RDC in real time even when the rotation speed of the motor MT is changed, while preventing the motor control system from becoming complicated or increasing in size and thereby preventing the cost for the motor control system from increasing.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A motor control system comprising:
   a motor;
   a resolver configured to detect a rotation angle of the motor;
   a resolver/digital converter configured to convert an analog angle signal output from the resolver into a digital angle signal; and
   a motor control unit configured to control the motor based on the digital angle signal output from the resolver/digital converter and determine, when an integrated value obtained by integrating the digital angle signal at a predetermined time interval is out of a threshold range, that the resolver/digital converter is abnormal, wherein
   the motor control unit increases the time interval when a rotation speed of the motor decreases and decreases the time interval when the rotation speed of the motor increases.

2. The motor control system according to claim 1, wherein the time interval is successively increased as the rotation speed of the motor decreases, and the time interval is successively decreased as the rotation speed of the motor increases.

3. The motor control system according to claim 1, wherein the motor control unit obtains the rotation speed of the motor based on a drive current of the motor.

4. A method for detecting an abnormality in a resolver/digital converter, comprising:
   converting, by a resolver/digital converter, a rotation angle of a motor detected by a resolve into a digital angle signal and integrating the obtained digital angle signal at a predetermined time interval; and
   determining, when the integrated value of the digital angle signal is out of a threshold range, that the resolver/digital converter is abnormal, wherein
   the time interval is increased when a rotation speed of the motor decreases, and is decreased when the rotation speed of the motor increases.

* * * * *